US012660156B2

(12) United States Patent
Lajoie et al.

(10) Patent No.: US 12,660,156 B2
(45) Date of Patent: Jun. 16, 2026

(54) INTERCONNECT STRUCTURES FOR INTEGRATED CIRCUITS

(71) Applicant: Intel Corporation, Santa Clara, CA (US)

(72) Inventors: Travis Lajoie, Forest Grove, OR (US); Tahir Ghani, Portland, OR (US); Jack T. Kavalieros, Portland, OR (US); Shem O. Ogadhoh, Beaverton, OR (US); Yih Wang, Portland, OR (US); Bernhard Sell, Portland, OR (US); Allen Gardiner, Portland, OR (US); Blake Lin, Portland, OR (US); Juan G. Alzate Vinasco, Tigard, OR (US); Pei-Hua Wang, Beaverton, OR (US); Chieh-Jen Ku, Hillsboro, OR (US); Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 16/645,362

(22) PCT Filed: Dec. 22, 2017

(86) PCT No.: PCT/US2017/068359
§ 371 (c)(1),
(2) Date: Mar. 6, 2020

(87) PCT Pub. No.: WO2019/125497
PCT Pub. Date: Jun. 27, 2019

(65) Prior Publication Data
US 2021/0125992 A1    Apr. 29, 2021

(51) Int. Cl.
*H01B 12/00*        (2006.01)
*H10B 12/00*        (2023.01)
(Continued)

(52) U.S. Cl.
CPC ............. *H10B 12/31* (2023.02); *H10B 12/48* (2023.02); *H10D 86/021* (2025.01);
(Continued)

(58) Field of Classification Search
CPC ......... H01L 27/10808; H01L 27/10882; H01L 27/124; H01L 27/1255; H01L 27/1259
(Continued)

(56) References Cited

U.S. PATENT DOCUMENTS 5,034,799 A * 7/1991 Tomita ................ H01L 23/5226
                                                            257/773
5,361,234 A * 11/1994 Iwasa ..................... H10B 12/00
                                                            257/306
(Continued)

FOREIGN PATENT DOCUMENTS

KR      10-2004-0070925        8/2004

OTHER PUBLICATIONS

Search Report for European Patent Application No. 17935707.4 mailed Jul. 12, 2021, 8 pgs.
(Continued)

*Primary Examiner* — Ori Nadav
(74) *Attorney, Agent, or Firm* — Schwabe, Williamson & Wyatt P.C.

(57)                ABSTRACT
Embodiments herein describe techniques for a semiconductor device having an interconnect structure above a substrate. The interconnect structure may include an inter-level dielectric (ILD) layer and a separation layer above the ILD layer. A first conductor and a second conductor may be within the ILD layer. The first conductor may have a first physical configuration, and the second conductor may have a second physical configuration different from the first physical configuration. Other embodiments may be described and/or claimed.

11 Claims, 9 Drawing Sheets

(51) Int. Cl.

| | |
|---|---|
| *H10D 86/01* | (2025.01) |
| *H10D 86/40* | (2025.01) |
| *H10D 86/60* | (2025.01) |

(52) U.S. Cl.
CPC ......... *H10D 86/441* (2025.01); *H10D 86/481* (2025.01); *H10D 86/60* (2025.01)

(58) Field of Classification Search
USPC ........................................................ 257/71
See application file for complete search history.

(56) References Cited

U.S. PATENT DOCUMENTS

| | | | | |
|---|---|---|---|---|
| 5,413,962 A | * | 5/1995 | Lur | H01L 23/5226 257/E23.161 |
| 5,578,860 A | * | 11/1996 | Costa | H01L 27/0617 257/E29.054 |
| 5,597,755 A | * | 1/1997 | Ajika | H01L 27/10852 257/E27.089 |
| 5,828,119 A | * | 10/1998 | Katsube | H01L 27/0251 257/551 |
| 7,180,117 B2 | | 2/2007 | Won | |
| 7,348,623 B2 | * | 3/2008 | Akiyama | H01L 23/5223 257/E21.582 |
| 7,371,651 B2 | * | 5/2008 | Won | H01L 28/65 438/393 |
| 9,595,528 B2 | * | 3/2017 | Takeuchi | H01L 21/76834 |
| 2002/0035961 A1 | * | 3/2002 | Natori | H01L 21/02197 117/54 |
| 2005/0079669 A1 | | 4/2005 | Goller | |
| 2007/0057305 A1 | | 3/2007 | Oates et al. | |
| 2007/0194361 A1 | | 8/2007 | Kokubun | |
| 2008/0105977 A1 | | 5/2008 | Luce | |
| 2008/0224228 A1 | | 9/2008 | Teo et al. | |
| 2015/0053965 A1 | * | 2/2015 | Lee | H10D 86/441 257/43 |
| 2016/0141291 A1 | | 5/2016 | Woo | |
| 2017/0084531 A1 | | 3/2017 | Gu | |
| 2017/0263715 A1 | | 9/2017 | Bouche | |
| 2017/0287842 A1 | | 10/2017 | Fu et al. | |
| 2017/0343498 A1 | | 11/2017 | Kalnitsky | |

OTHER PUBLICATIONS

International Report on Patentability for International Application No. PCT/US2017/068359 mailed Jul. 2, 2020, 10 pgs.

International Search Report and Written Opinion for International Patent Application No. PCT/US2017/068359 mailed Sep. 21, 2018, 15 pgs.

Office Action for European Patent Application No. 17935707.4 mailed Sep. 26, 2024, 8 pgs.

Office Action for European Patent Application No. 17935707.4 mailed Jun. 19, 2023, 9 pgs.

Notice of Allowance for European Patent Application No. 17935707.4 mailed Dec. 17, 2025, 8 pgs.

* cited by examiner

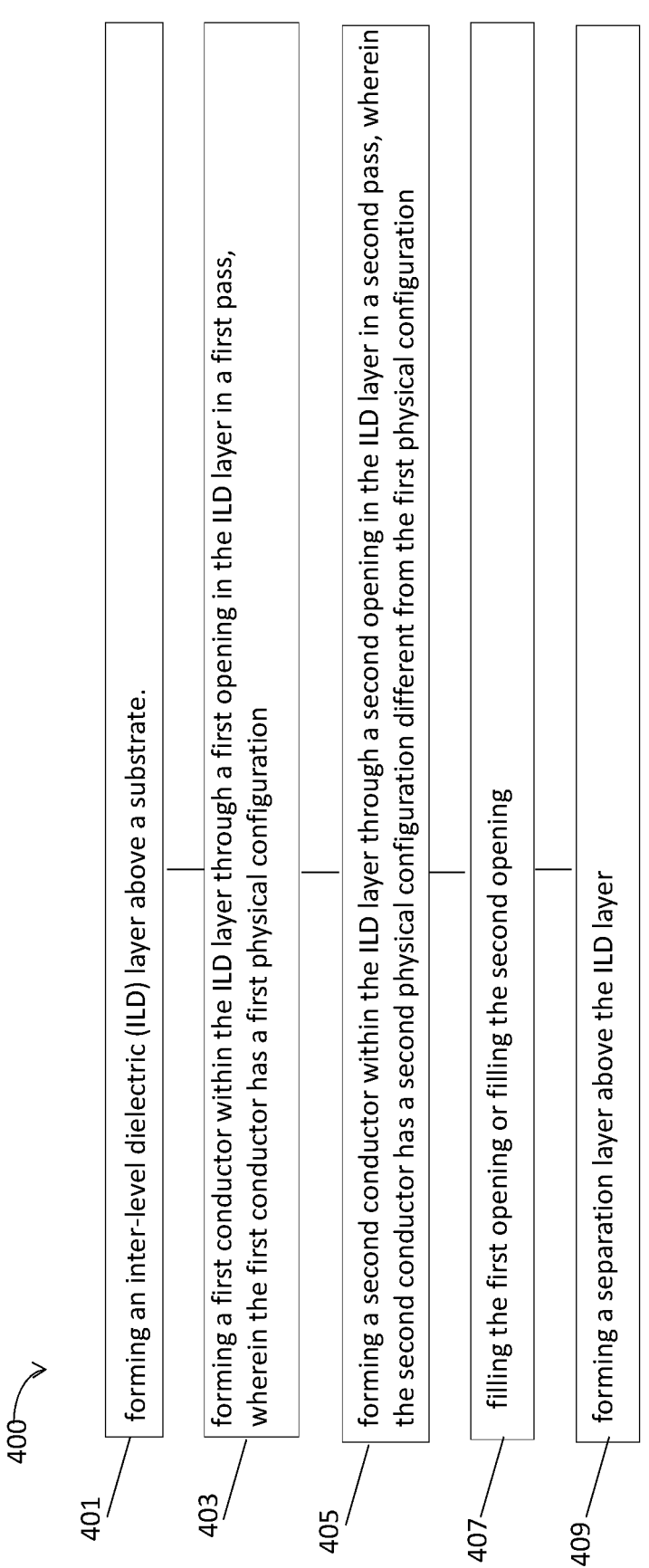

400

401　forming an inter-level dielectric (ILD) layer above a substrate.

403　forming a first conductor within the ILD layer through a first opening in the ILD layer in a first pass, wherein the first conductor has a first physical configuration 405　forming a second conductor within the ILD layer through a second opening in the ILD layer in a second pass, wherein the second conductor has a second physical configuration different from the first physical configuration 407　filling the first opening or filling the second opening 409　forming a separation layer above the ILD layer

Figure 4

INTERCONNECT STRUCTURES FOR INTEGRATED CIRCUITS

CROSS-REFERENCE TO RELATED APPLICATION

This patent application is a U.S. National Phase Application under 35 U.S.C. § 371 of International Application No. PCT/US2017/068359, filed Dec. 22, 2017, entitled "INTER-CONNECT STRUCTURES FOR INTEGRATED CIR-CUITS," which designates the United States of America, the entire disclosure of which is hereby incorporated by reference in its entirety and for all purposes.

FIELD

Embodiments of the present disclosure generally relate to the field of integrated circuits, and more particularly, to interconnect structures for integrated circuits.

BACKGROUND

Interconnect structures for an integrated circuit (IC) or a semiconductor device, e.g., a memory, a logic application, a radio frequency (RF) application, may connect various components of the IC or the semiconductor device to function together. An interconnect structure may include multiple layers of conductors coupled to each other by vias through inter-level dielectric (ILD) layers separating the conductors. A conductor may also be referred to as a conductive contact, a contact, a metal line, or any other terms used in the industry. Vias may be used to connect one conductor in a metal layer to another conductor in another metal layer. An interconnect structure may include multiple conductors formed as multiple metal lines patterned and etched in multiple steps. More routing and extra process steps may be performed at upper metal layers to connect the conductors at the upper metal layers than for conductors at the lower metal layers. Fabrication of interconnect structures may be among the most process-intensive and cost-sensitive portions of IC manufacturing.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 4 illustrates a process for forming an interconnect structure of a semiconductor device including multiple conductors of different physical configurations within an ILD layer, in accordance with some embodiments.

DETAILED DESCRIPTION

Figure 1:
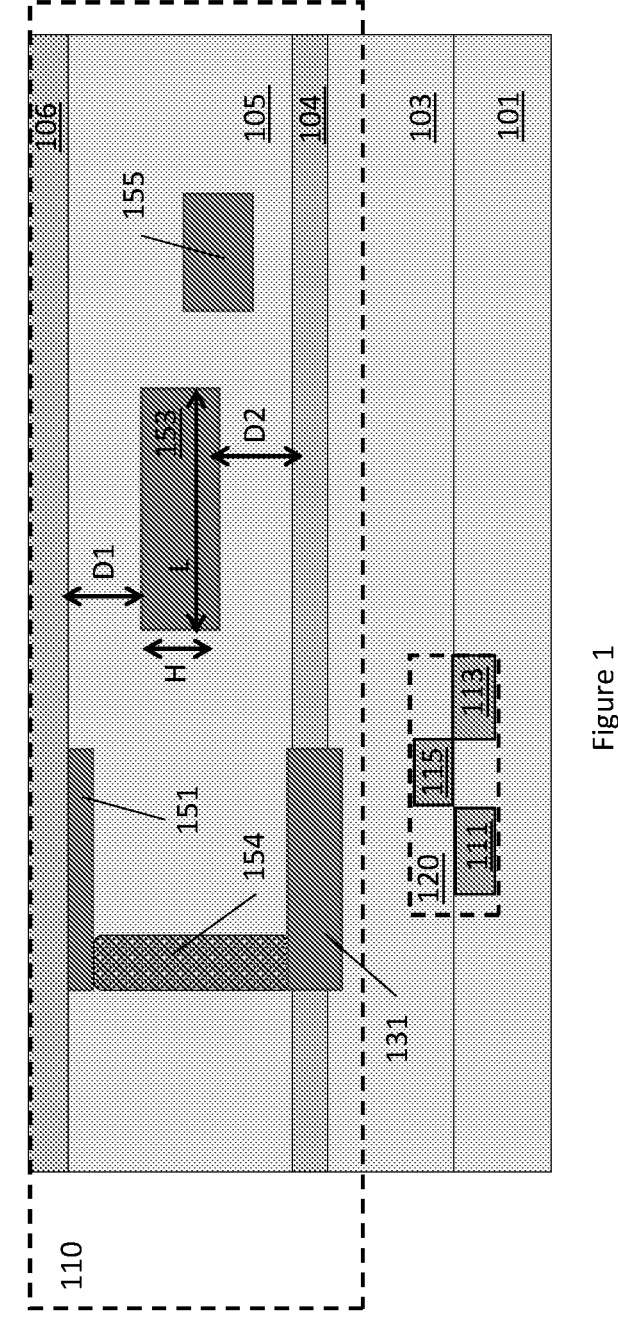
FIG. 1 schematically illustrates a diagram of an interconnect structure of a semiconductor device including multiple conductors of different physical configurations within an inter-level dielectric (ILD) layer, in accordance with some embodiments.

An interconnect structure for an integrated circuit (IC) may include multiple conductors formed as metal lines separated by inter-level dielectric (ILD) layers, which are patterned and etched in multiple steps. When conductors of different resistor-capacitor (RC) properties may be used, current techniques may have those conductors of different RC properties in additional metal layers. In addition, current techniques may connect one conductor with another conductor with vias through one or more ILD layers. The use of more metal layers may result in more routing and extra process steps to be performed.

Embodiments herein may include multiple conductors of different physical configurations to be formed within an ILD layer. Furthermore, short vias and interstitial bridge vias may be used within an ILD layer or through an ILD layer to connect multiple conductors. Hence, the number of metal layers and ILD layers may be reduced, leading to reduced cost for fabricating ICs.

Embodiments herein may present a semiconductor device having an interconnect structure above a substrate. The interconnect structure may include an ILD layer and a separation layer above the ILD layer. A first conductor and a second conductor may be within the ILD layer. The first conductor may have a first physical configuration, and the second conductor may have a second physical configuration different from the first physical configuration.

Embodiments herein may present a method for forming a semiconductor device. The method may include: forming an ILD layer above a substrate; forming a first conductor within the ILD layer through a first opening in the ILD layer in a first pass, wherein the first conductor has a first physical configuration; forming a second conductor within the ILD layer through a second opening in the ILD layer in a second pass, wherein the second conductor has a second physical configuration different from the first physical configuration; filling the first opening and filling the second opening; and forming a separation layer above the ILD layer.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a capacitor as a storage cell. The transistor in the memory cell may include a gate electrode coupled to a word line of the memory array, a source electrode coupled to a bit line of the memory array, and a drain electrode coupled to a first plate of the capacitor by a short via. The capacitor may further include a second plate coupled to a source line of the memory array. In addition, the source electrode, the drain electrode, and the first plate of the capacitor are within a dielectric layer above the gate electrode.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of an interconnect structure 110 of a semiconductor device 100 including multiple conductors, e.g., a conductor 151, a conductor 153, and a conductor 155, of different physical configurations within an inter-level dielectric (ILD) layer, e.g., an ILD layer 105, in accordance with some embodiments. For clarity, features of the semiconductor device 100, the interconnect structure 110, the conductor 151, the conductor 153, the conductor 155, and the ILD layer 105, may be described below as examples for understanding an example semiconductor device, and an interconnect structure including multiple conductors within an ILD layer. It is to be understood that there may be more or fewer components within a semiconductor device, and an interconnect structure including multiple conductors within an ILD layer. Further, it is to be understood that one or more of the components within a semiconductor device, and an interconnect structure including multiple conductors within an ILD layer may include additional and/or varying features from the description below, and may include any device that one having ordinary skill in the art would consider and/or refer to as a semiconductor device, and an interconnect structure including multiple conductors within an ILD layer.

In embodiments, the semiconductor device 100 may include a substrate 101, and the interconnect structure 110 above the substrate 101. The interconnect structure 110 may include an ILD layer 103 above the substrate 101, and the ILD layer 105 above the ILD layer 103. A separation layer 104 may be above the ILD layer 103, and a separation layer 06 may be above the ILD layer 105. A conductor 131 may be within the ILD layer 103 and the separation layer 104. The ILD layer 105 may include the conductor 151, the conductor 153, and the conductor 155. A via 154 may be through the ILD layer 105 to couple the conductor 151 and the conductor 131. In addition, the semiconductor device 100 may include other devices, e.g., a transistor 120 having a source area 111 and a drain area 113 within the substrate 101, and a gate electrode 115 above the substrate 101. There may be other components, such as passive components within the ILD 103 or the ILD 105, not shown.

In embodiments, the conductor 131, the conductor 151, the conductor 153, and the conductor 155 may have different physical configurations. For a conductor, its physical configuration may include parameters such as a shape, a size, a height, a material, a first depth from a first surface of the ILD layer to the conductor, or a second depth from a second surface of the ILD layer to the conductor. For example, the conductor 153 may be of a rectangular shape in a cross-sectional view, and may have a length L, and a height H. In three dimension, the conductor 153 may have a width W, not shown. Furthermore, the conductor 153 may have a first depth D1 from a top surface of the ILD layer 105, and a second depth D2 from a bottom surface of the ILD layer 105. The conductor 153 may have an area size, which may be a product of H*L in cross-sectional view, an area size L*W in top down view, or a volume H*W*L in three dimensions. In general, a size of a conductor may refer to a geometric measurement of the conductor, which may be a length, a width, a height, an area size, a volume size, a radius, and so on. Other conductors, e.g., the conductor 131, the conductor 151, and the conductor 155 may have a physical configuration different from the physical configuration of the conductor 153. For example, the conductor 131 may have a surface coplanar with a surface of the separation layer 104, and the conductor 151 may have a surface coplanar with a surface of the ILD layer 105.

In some current technology, conductors with different physical configurations may be placed in different ILD layers, which may increase the processing steps as well as the die area for the semiconductor device. In embodiments, the use of conductors with different physical configurations, e.g., the conductor 151, the conductor 153, and the conductor 155, in a same ILD layer, e.g., the ILD layer 105, may allow conductors with different intrinsic capacitances to be patterned at a same ILD layer. Hence, the number of patterning steps and area required to pattern the circuits and the semiconductor device may be reduced.

Figure 2:
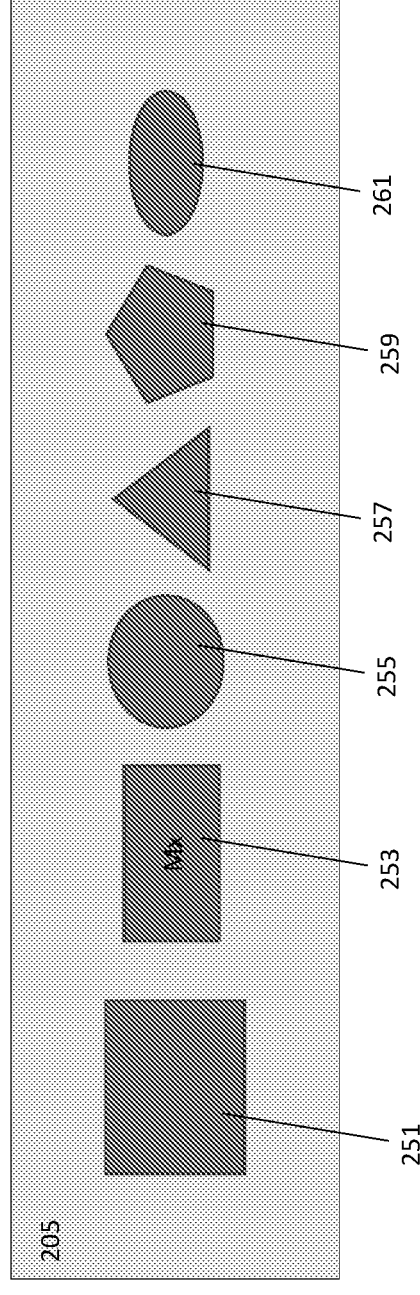
FIG. 2 schematically illustrates multiple conductors of different physical configurations within an ILD layer, in accordance with some embodiments.

In embodiments, a physical configuration of a conductor may include a shape of the conductor. For example, the conductor 153 may alternatively be of a triangular shape, a square shape, a circular shape, an elliptical shape, or a polygon comprising three or more sides. As shown in FIG. 2, the conductor 153 may be similar to a conductor 251 of a square shape, a conductor 253 of a rectangular shape, a conductor 255 of a circular shape, a conductor 257 of a triangular shape, a conductor 259 of a polygon comprising three or more sides, or a conductor 261 of an elliptical shape. One or more of the conductor 251, the conductor 253, the conductor 255, the conductor 257, the conductor 259, or the conductor 261 may be within an ILD layer 205, which may be similar to the ILD layer 105 shown in FIG. 1.

In embodiments, a physical configuration of a conductor may include a material of the conductor. For example, the conductor 131, the conductor 151, the conductor 153, and the conductor 155 may be formed as a single layer or a stacked layer using one or more conductive films including a conductive material. For example, the conductor 131, the conductor 151, the conductor 153, and the conductor 155 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. For example, the conductor 131, the conductor 151, the conductor 153, and the conductor 155 may include tantalum nitride (TaN), titanium nitride (TiN), iridium-tantalum alloy (Ir-Ta), indium-tin oxide (ITO), the like, and/or a combination thereof.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 or the ILD layer 105 may include silicon dioxide (Sift), carbon doped oxide (CDO), silicon nitride, perfluorocyclobutane, polytetrafluoroethylene, fluorinated silicate glass (FSG), organic polymer, siloxane, a porous dielectric material, or organosilicate glass. In some embodiments, the ILD layer 103 or the ILD layer 105 may include some low-k dielectric materials. Suitable dielectric materials may include carbon-doped silicon dioxide materials, organic polymeric thermoset materials, silicon oxycarbide; SiCOH dielectrics; fluorine doped silicon oxide; spin-on glasses, silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric material.

In embodiments, the separation layer 104 or the separation layer 106 may include one or more of an etching stop layer, a barrier layer, a capping layer, or a hard mask layer. For example, the separation layer 104 may be a hardmask layer including silicon nitride, silicon carbide, or silicon oxide. In some embodiments, the separation layer 104 may include a barrier layer comprising, for example, a titanium (Ti) layer, titanium-nitride (TiN) layer, tantalum (Ta) layer, tantalum-nitride (TaN) layer or other material layer that is capable of reducing or preventing metallic ions of the conductors, e.g., the conductor 131, the conductor 151, the conductor 153, and the conductor 155, from diffusing into the surrounding regions of the substrate.

FIGS. 3(a)-3(d) schematically illustrate an interconnect structure 300 of a semiconductor device including a conductor coupled to another conductor within one or more ILD layers, e.g., by interstitial bridge vias, in accordance with some embodiments. In embodiments, the interconnect structure 300 may include a conductor 331 coupled to a conductor 333, a conductor 351 coupled to a conductor 353, a conductor 371 coupled to a conductor 373, and a conductor 391 coupled to a conductor 313. The interconnect structure 300, the conductor 331, the conductor 333, the conductor 351, the conductor 353, the conductor 371, the conductor 373, the conductor 391, or the conductor 313 may be similar to the interconnect structure 100, the conductor 131, the conductor 151, the conductor 153, and the conductor 155, as shown in FIG. 1.

In embodiments, the interconnect structure 300 may include an ILD layer 303, an ILD layer 305, an ILD layer 307, an ILD layer 309, and an ILD layer 311 above the ILD layer 309 with a separation layer 308 in between. In some embodiments, the ILD layer 303, the ILD layer 305, the ILD layer 307, the ILD layer 309, or the ILD layer 311 may be the same ILD layer. In some other embodiments, the ILD layer 303, the ILD layer 305, the ILD layer 307, the ILD layer 309, or the ILD layer 311 may include at least two different ILD layers.

Figures 3A, 3B, 3C:
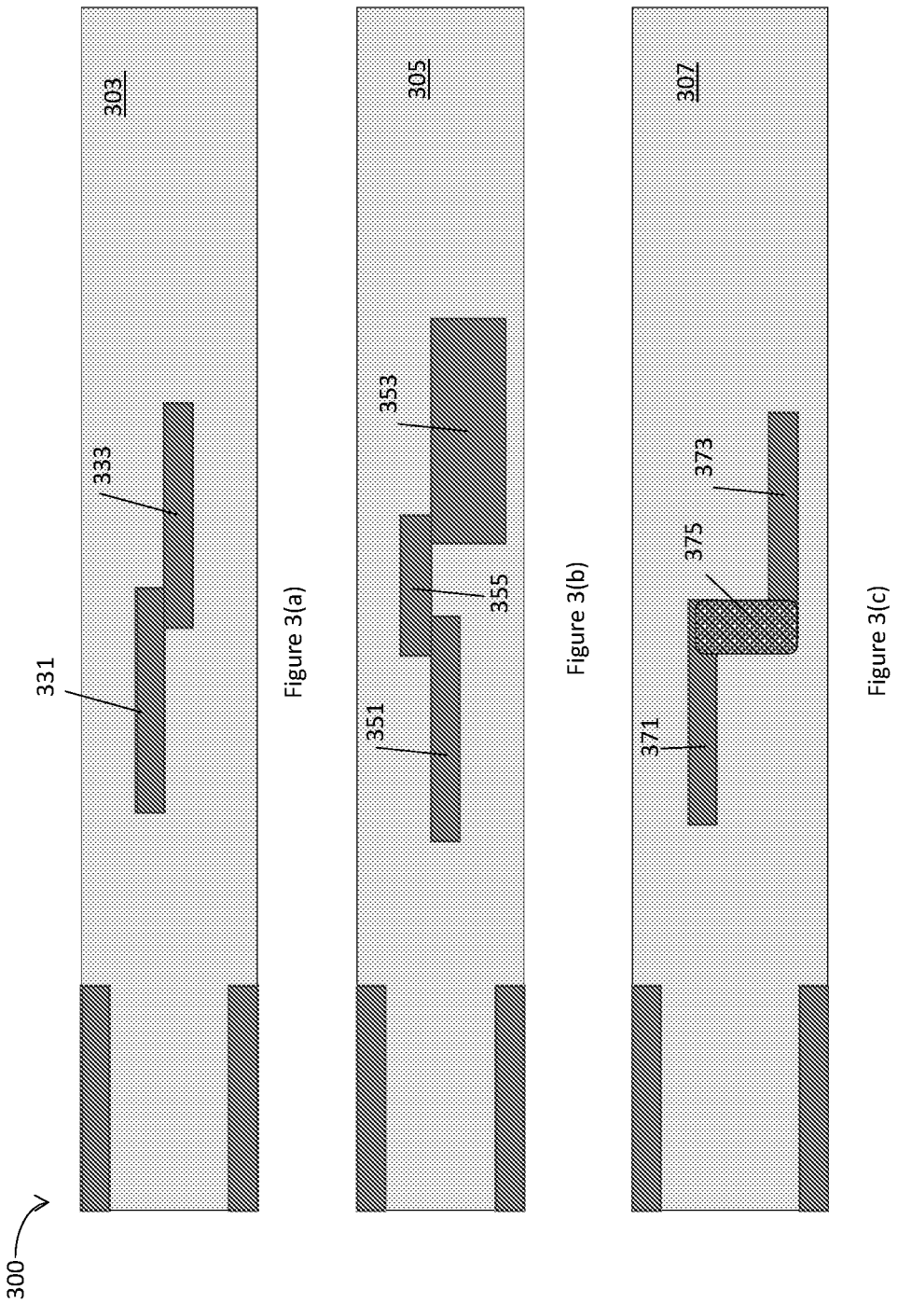
FIGS. 3(a)-3(d) schematically illustrate an interconnect structure of a semiconductor device including a conductor coupled to another conductor within one or more ILD layers, e.g., by interstitial bridge vias, in accordance with some embodiments.
Figure 3D:
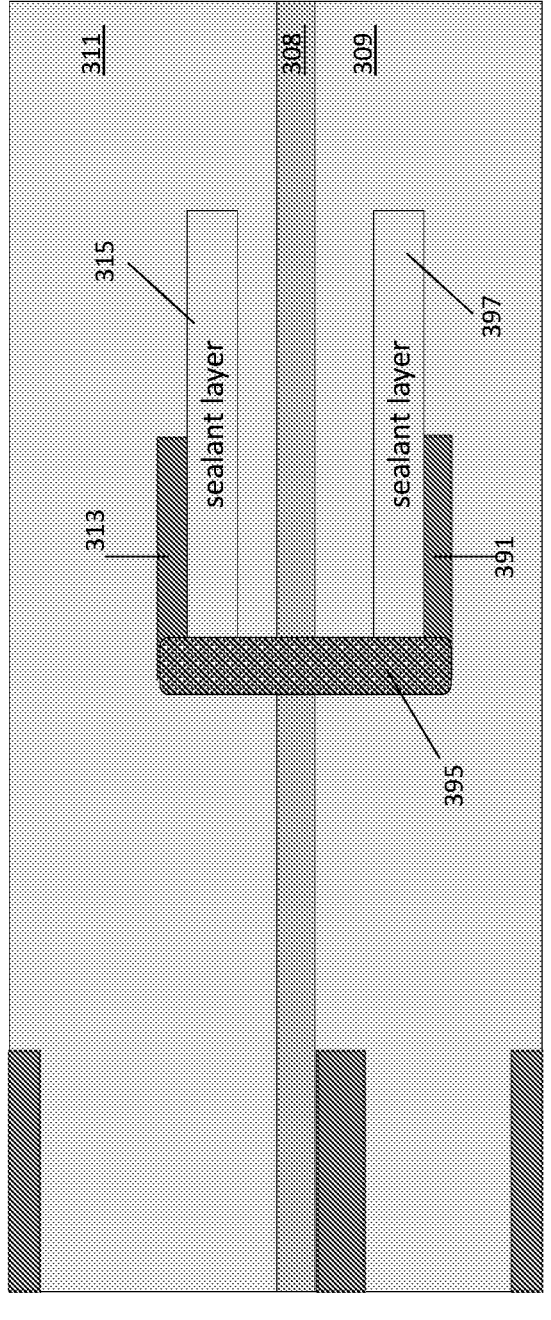

In embodiments, a conductor may be coupled to another conductor in various ways. For example, as shown in FIG. 3(a), the conductor 331 may overlap and be in direct contact with the conductor 333, within the ILD layer 303. As shown in FIG. 3(b), the conductor 351 may be coupled to the conductor 353 through an interstitial bridge via 355 in a lateral direction parallel to a surface of the ILD layer 305. As shown in FIG. 3(c), the conductor 371 may be coupled to the conductor 373 through an interstitial bridge via 375, in a vertical direction with respect to a surface of the ILD layer 307. In addition, as shown in FIG. 3(d), the conductor 391 in the ILD layer 309 may be coupled to the conductor 313 in the ILD layer 311 through an interstitial bridge via 395 in a vertical direction with respect to a surface of the ILD layer 309. The interstitial bridge via 395 may further extend through the separation layer 308 into the ILD layer 311 above the separation layer 308.

In some current technology, conductors may be coupled in different ILD layers by via in a vertical direction, where the conductors are coplanar to surfaces of different ILD layers. The use of direct overlap between two conductors, e.g., the conductor 331 directly overlapping with the conductor 333, an interstitial bridge via in a lateral direction, e.g., the interstitial bridge via 355, or an interstitial bridge via in a vertical direction, e.g., the interstitial bridge via 375, and the interstitial bridge via 395, may reduce the number of metal layers, and hence the number of patterning steps and area for the semiconductor device.

Furthermore, as shown in FIG. 3(d), the interconnect structure 300 may further include a sealant layer above, below, or adjacent to a conductor. For example, a sealant layer 397 may be above the conductor 391, and adjacent to the interstitial bridge via 395. A sealant layer 315 may be below the conductor 313, and adjacent to the interstitial bridge via 395. The sealant layer 397 and the sealant layer 315 may have various physical configurations such as shape, size, height, a first depth from a first surface of the ILD layer, or a second depth from a second surface of the ILD layer.

In embodiments, the sealant layer 397 and the sealant layer 315 may include at least a material to act as the passivation layer, the hermetic sealant layer, the etching stop layer, and the hard mask layer. For example, the sealant layer 397 and the sealant layer 315 may include $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, or HYO. Since a material in the sealant layer 397 and the sealant layer 315 may act as a passivation layer, a hermetic sealant layer, an etching stop layer, and a hard mask layer, the sealant layer 397 and the sealant layer 315 may perform multiple functions. In some other embodiments, the sealant layer 397 and the sealant layer 315 may include multiple sealant sub-layers to act as a passivation layer, a hermetic sealant layer, an etching stop layer, and a hard mask layer.

FIG. 4 illustrates a process 400 for forming an interconnect structure of a semiconductor device including multiple conductors of different physical configurations within an ILD layer, in accordance with some embodiments. In embodiments, the process 400 may be applied to form the interconnect structure 110 in FIG. 1, or the interconnect structure 300 in FIGS. 3(a)-3(d).

At block 401, the process 400 may include forming an ILD layer above a substrate. For example, the process 400 may include forming the ILD layer 105 above the substrate 101, as shown in FIG. 1.

At block 403, the process 400 may include forming a first conductor within the ILD layer through a first opening in the ILD layer in a first pass, wherein the first conductor has a first physical configuration. For example, the process 400 may include forming the conductor 153 within the ILD layer 105 through a first opening, not shown, in the ILD layer 105 in a first pass. The conductor 153 may have the length L, the height H, the first depth D1 from the top surface of the ILD layer 105, and the second depth D2 from the bottom surface of the ILD layer 105, as shown in FIG. 1.

At block 405, the process 400 may include forming a second conductor within the ILD layer through a second opening in the ILD layer in a second pass, wherein the second conductor has a second physical configuration different from the first physical configuration. For example, the process 400 may include forming the conductor 155 within the ILD layer 105 through a second opening, not shown, in the ILD layer 105 in a second pass. The conductor 155 may have a second physical configuration different from the first physical configuration for the conductor 153. For example, the conductor 155 may be of a rectangular shape, with different length, height, different depths from surfaces to the ILD layer 105, from the conductor 153.

At block 407, the process 400 may include filling the first opening and filling the second opening. For example, the process 400 may include filling the first opening and filling the second opening formed in order to form the conductor 153 and the conductor 155. The first opening and the second opening may be filled together at a same time. Additionally and alternatively, the first opening and the second opening may be filled separately.

At block 409, the process 400 may include forming a separation layer above the ILD layer. For example, the process 400 may include forming the separation layer 106 above the ILD layer 105.

In addition, the process 400 may include additional operations to form other layers, e.g., more ILD layers, encapsulation layers, insulation layers, not shown. The process 400 may also include forming an interstitial bridge via within the ILD layer to couple a conductor with another conductor. For example, the process 400 may include forming an interstitial bridge via within the ILD layer 105 to couple the conductor 153 with the conductor 155, not shown.

Figure 5:
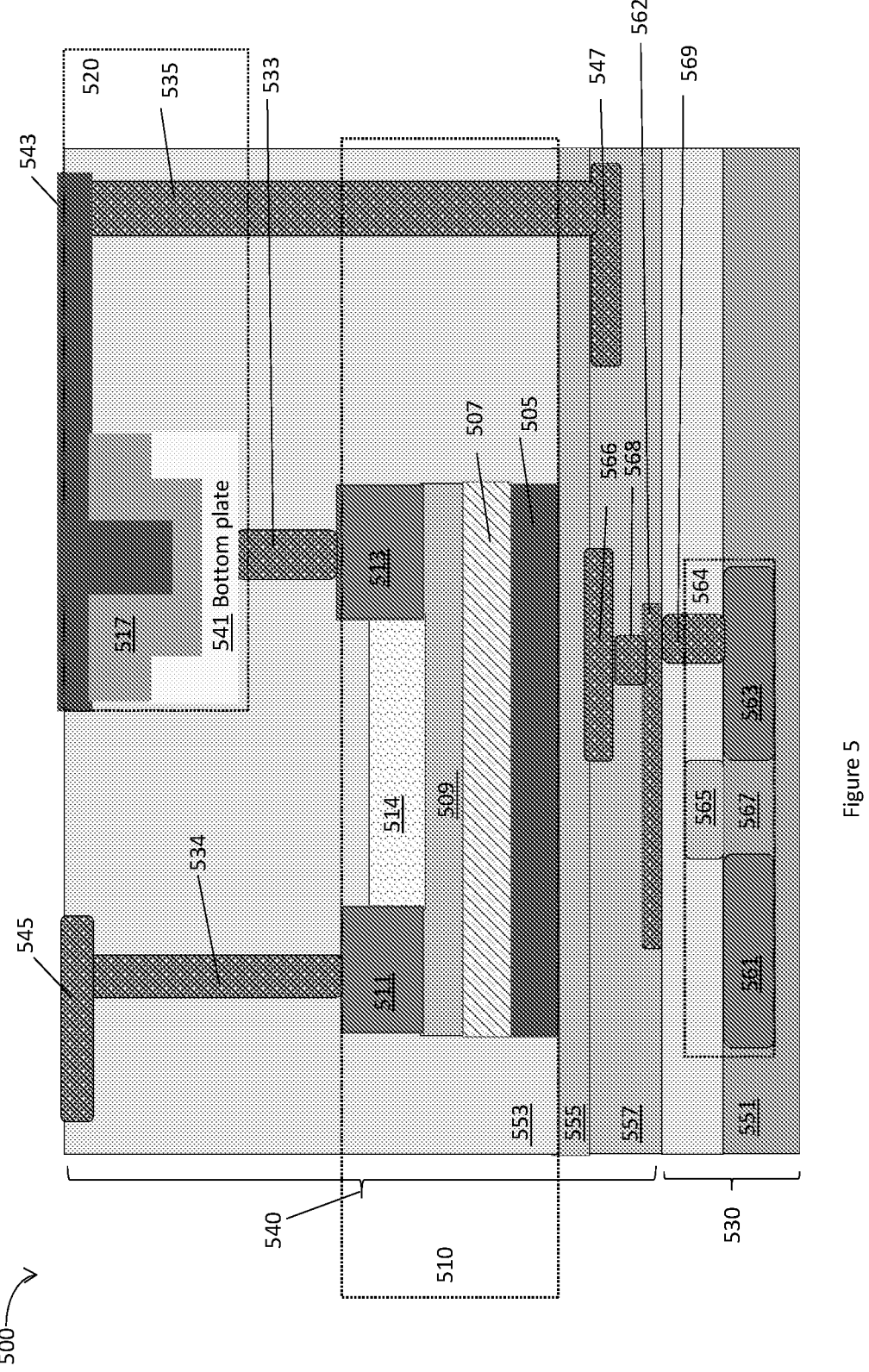
FIG. 5 schematically illustrates an interconnect structure of a semiconductor device including multiple conductors coupled by short vias within an ILD layer, and formed in back-end-of-line (BEOL) on a substrate, in accordance with some embodiments.

FIG. 5 schematically illustrates an interconnect structure 540 of a semiconductor device 500 including multiple conductors, e.g., a conductor 511, a conductor 513, a conductor 541, a conductor 543, a conductor 545, coupled by short vias, e.g., a short via 533, and a short via 534, and formed in back-end-of-line (BEOL) on a substrate 551, in accordance with some embodiments. The interconnect structure 540, the conductor 511, the conductor 513, the conductor 541, the conductor 543, and the conductor 545, may be similar to the interconnect structure 110, the conductor 131, the conductor 151, the conductor 153, and the conductor 155, as shown in FIG. 1.

In embodiments, the interconnect structure 540 may be formed at BEOL, within an ILD 553. The interconnect structure 540 may include a thin-film-transistor (TFT) 510 coupled to a capacitor 520 to form a memory cell. The conductor 511 and the conductor 513 may be a source electrode and a drain electrode of the TFT 510. The conductor 541 and the conductor 543 may be a bottom plate and a top plate of the capacitor 520, respectively. The conductor 541 may be coupled to the conductor 513 by the short via 533, while the conductor 545 and the conductor 511 may be coupled by the short via 534. The short via 533 and the short via 534 may connect two conductors within a same ILD layer. The short via 533 and the short via 534 may be shorter than a normal via, which may couple a conductor in one ILD layer to another conductor in another ILD layer. The use of the short via 533 and the short via 534 may allow the capacitor 520 to land directly on top of a TFT, e.g., the TFT 510, without adding an extra ILD layer. If a normal via is used, an additional ILD layer may be needed to accommodate the capacitor. Furthermore, a short via may also be used to connect a component, such as resistors, or any other passive component, to another component within a same ILD layer.

In embodiments, the capacitor 520 may include the conductor 541 and the conductor 543 separated by a dielectric layer 517. The TFT 510 may include the conductor 511 and the conductor 513 as a source electrode and a drain electrode. In addition, the TFT 510 may include a gate electrode 505, a gate dielectric layer 507, a channel layer 509, and a capping layer 514 above the channel layer 509, between the conductor 511 and the conductor 513.

In addition to the TFT 510 within the ILD layer 553, the interconnect structure 540 may further include an ILD layer 557 separted from the ILD layer 553 by a separation layer 555, where one or more vias, e.g., a via 568, may be connected to one or more conductors, e.g., a conductor 566, and a conductor 562 within the ILD layer 557. In embodiments, the conductor 566 and the conductor 562 may be of different metal layers at the interconnect structure 540. The ILD layer 557 is shown for example only. Although not shown by FIG. 5, in various embodiments there may be multiple ILD layers included in the interconnect structure 540. An interstitial bridge via 535 may couple the conductor 543 to a conductor 547 in a vertical direction through the separation layer 555, where the conductor 543 may be within the ILD layer 553, and the conductor 547 may be within the ILD layer 557.

In embodiments, the interconnect structure 540 may be formed on the front-end-of-line (FEOL) 530. The FEOL 530 may include the substrate 551. In addition, the FEOL 530 may include other devices, e.g., a transistor 564. In embodiments, the transistor 564 may be a FEOL transistor, including a source 561, a drain 563, and a gate 565, with a channel 567 between the source 561 and the drain 563 under the gate 565. Furthermore, the transistor 564 may be coupled to interconnects, e.g., the conductor 562, through a via 569.

Figure 6:
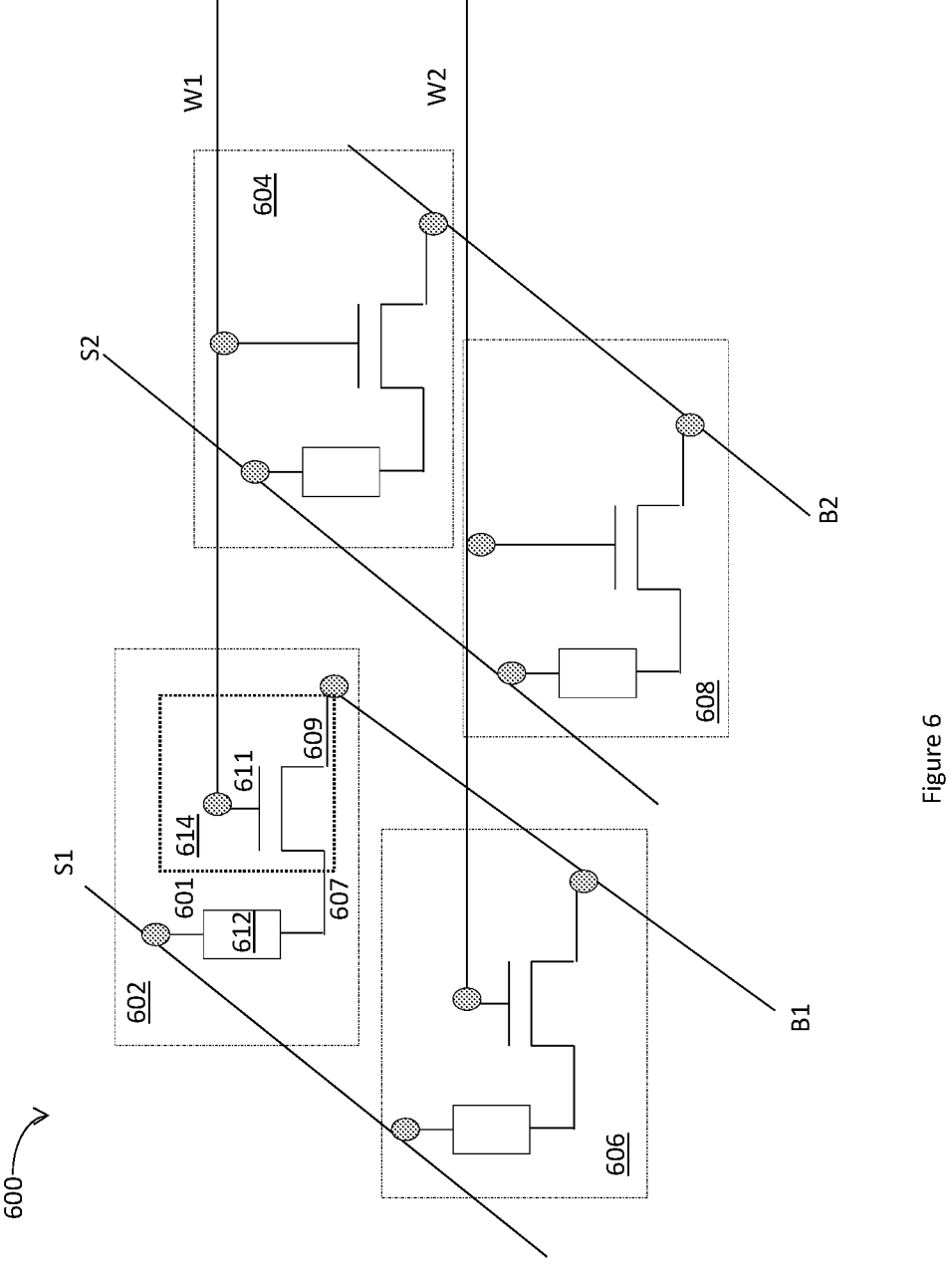
FIG. 6 schematically illustrates a memory array with multiple memory cells, where a memory cell may include multiple conductors coupled by short vias within an ILD layer, in accordance with some embodiments.

FIG. 6 schematically illustrates a memory array 600 with multiple memory cells (e.g., a memory cell 602, a memory cell 604, a memory cell 606, and a memory cell 608), where a TFT, e.g., a TFT 614, may be a selector of a memory cell, e.g., the memory cell 602, in accordance with various embodiments. In embodiments, the memory cell 602 may include the TFT 614 coupled to a storage cell 612 that may be a capacitor, which may be called a 1T1C configuration. The TFT 614 may be an example of the TFT 510, and the storage cell 612 may be an example of the capacitor 520, as shown in FIG. 5. The TFT 614 may include a gate electrode 611 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 602 may be coupled in series with the other memory cells of the same row, and may be coupled in parallel with the memory cells of the other rows. The memory array 600 may include any suitable number of one or more memory cells.

In embodiments, multiple memory cells, such as the memory cell 602, the memory cell 604, the memory cell 606, and the memory cell 608, may have a similar configuration. The memory cell 602 may be controlled through multiple electrical connections to read from the memory cell, write to the memory cell, and/or perform other memory operations. In some embodiments, the storage cell 612 may be another type of storage device, e.g., a resistive random access memory (RRAM) cell.

The TFT 614 may be a selector for the memory cell 602. A word line W1 of the memory array 600 may be coupled to a gate electrode 611 of the TFT 614. When the word line W1 is active, the TFT 614 may select the storage cell 612. A source line Si of the memory array 600 may be coupled to an electrode 601 of the storage cell 612, while another electrode 607 of the storage cell 612 may be shared with the TFT 614. In addition, a bit line B1 of the memory array 600 may be coupled to another electrode, e.g., an electrode 609 of the TFT 614. The shared electrode 607 may be a source electrode or a drain electrode of the TFT 614, while the electrode 609 may be a drain electrode or a source electrode of the TFT 614. A drain electrode and a source electrode may be used interchangeably herein. Additionally, a source line and a bit line may be used interchangeably herein.

In various embodiments, the memory cells and the transistors, e.g., the memory cell 602 and the TFT 614, included in the memory array 600 may be formed in BEOL, as shown in FIG. 5. Accordingly, the memory array 600 may be formed in higher metal layers, e.g., metal layer 3 and/or metal layer 6, of the integrated circuit above the active substrate region, and may not occupy the active substrate area that is occupied by conventional transistors or memory devices.

Figure 7:
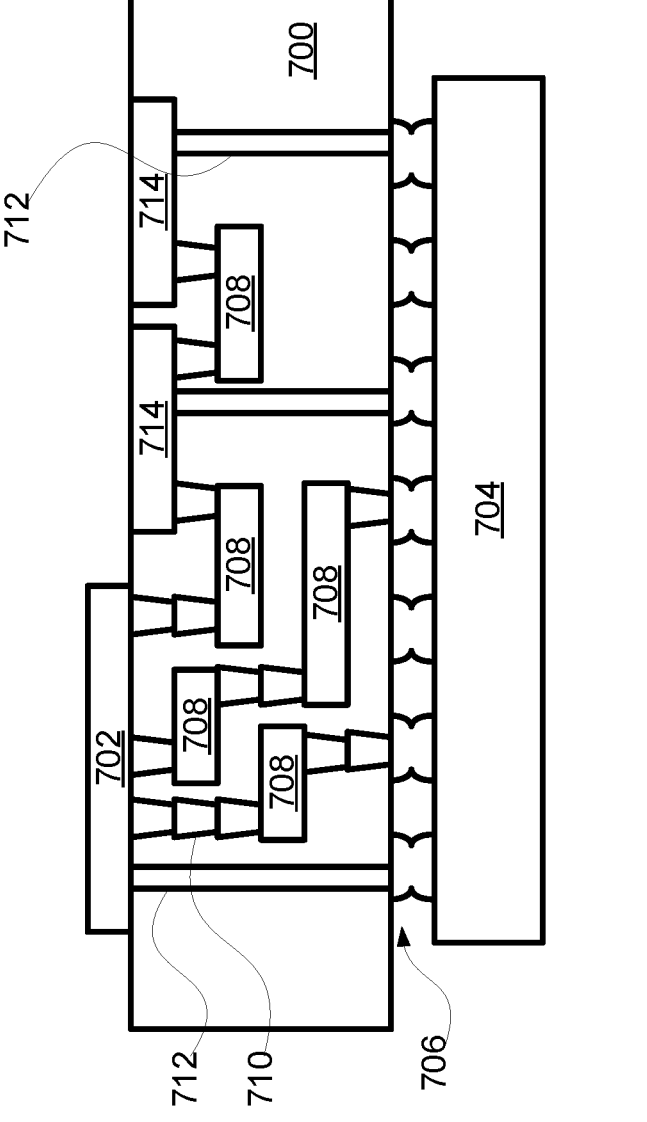
FIG. 7 schematically illustrates an interposer implementing one or more embodiments of the disclosure, in accordance with some embodiments.

FIG. 7 illustrates an interposer 700 that includes one or more embodiments of the disclosure. The interposer 700 is an intervening substrate used to bridge a first substrate 702 to a second substrate 704. The first substrate 702 may be, for instance, a substrate support for a semiconductor device, e.g., the semiconductor device 100 shown in FIG. 1, or the semiconductor device 500 shown in FIG. 5. The second substrate 704 may be, for instance, a memory module, a computer motherboard, or another integrated circuit die. For example, the second substrate 704 may be a memory module including the memory array 600 as shown in FIG. 6. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the disclosure, apparatuses or processes disclosed herein may be used in the fabrication of interposer 700.

Figure 8:
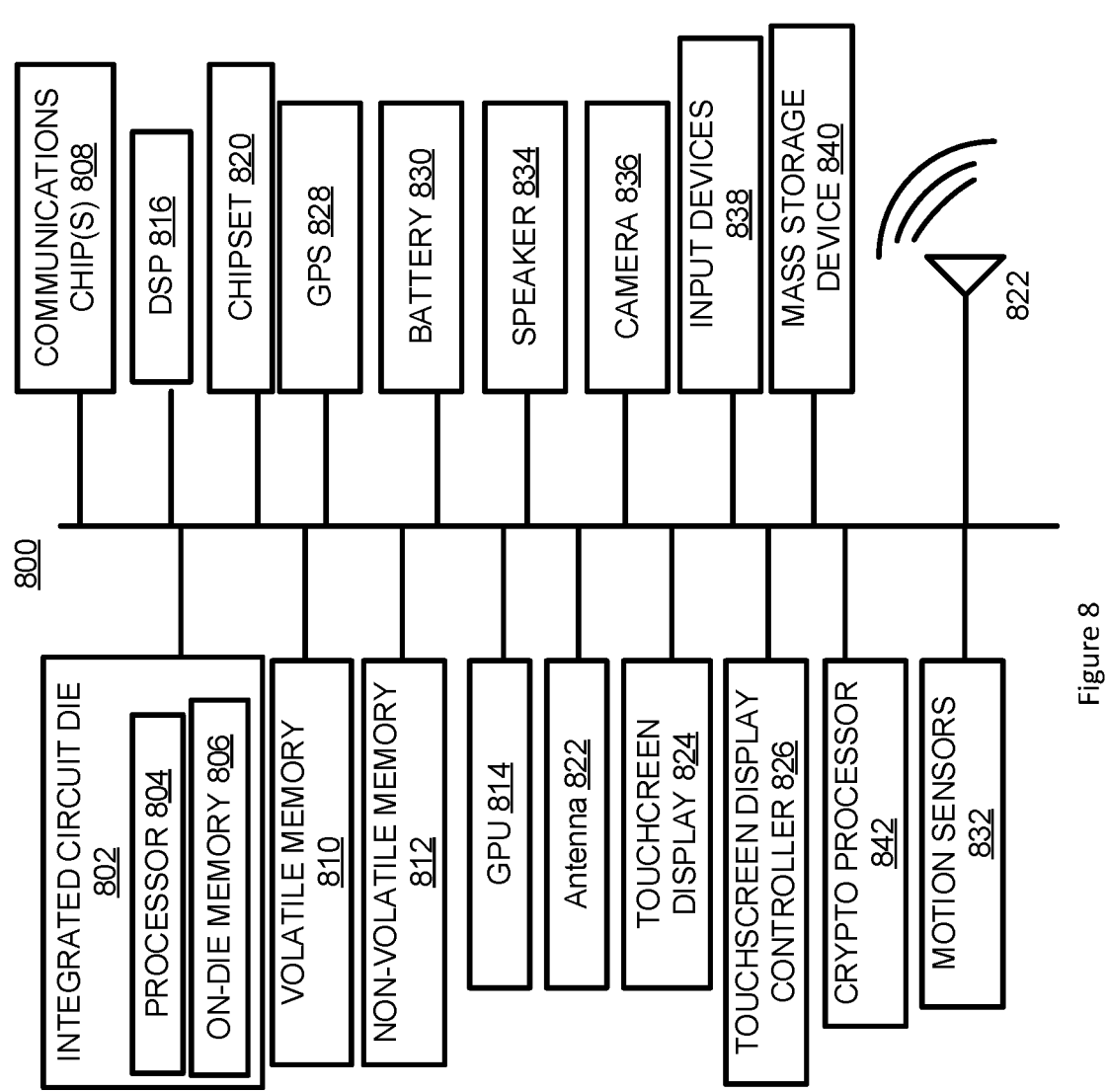
FIG. 8 schematically illustrates a computing device built in accordance with an embodiment of the disclosure, in accordance with some embodiments.

FIG. 8 illustrates a computing device 800 in accordance with one embodiment of the disclosure. The computing device 800 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a processor 804 as well as on-die memory 806, often used as cache memory, which can be provided by technologies such as embedded DRAM (eDRAM), or SRAM. For example, the on-die memory 806 may include the semiconductor device 100 shown in FIG. 1, or the semiconductor device 500 shown in FIG. 5.

In embodiments, the computing device 800 may include a display or a touchscreen display 824, and a touchscreen display controller 826. A display or the touchscreen display 824 may include a FPD, an AMOLED display, a TFT LCD, a micro light-emitting diode (μLED) display, or others. For example, the touchscreen display 824 may include the semiconductor device 100 shown in FIG. 1, or the semiconductor device 500 shown in FIG. 5.

Computing device 800 may include other components that may or may not be physically and electrically coupled to the motherboard or fabricated within a SoC die. These other components include, but are not limited to, volatile memory 810 (e.g., dynamic random access memory (DRAM), non-volatile memory 812 (e.g., ROM or flash memory), a graphics processing unit 814 (GPU), a digital signal processor (DSP) 816, a crypto processor 842 (e.g., a specialized processor that executes cryptographic algorithms within hardware), a chipset 820, at least one antenna 822 (in some implementations two or more antenna may be used), a battery 830 or other power source, a power amplifier (not shown), a voltage regulator (not shown), a global positioning system (GPS) device 828, a compass, a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 includes one or more devices, such as transistors. The term "processor" may refer to any device or portion of a device that processes electronic data from registers and/or memory to transform that electronic data into other electronic data that may be stored in registers and/or memory. The communications logic unit 808 may also include one or more devices, such as transistors.

In further embodiments, another component housed within the computing device 800 may contain one or more devices, such as DRAM, that are formed in accordance with implementations of the current disclosure, e.g., the semiconductor device 100 shown in FIG. 1, or the semiconductor device 500 shown in FIG. 5.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples are provided below.

Example 1 may include a semiconductor device, comprising: an interconnect structure above a substrate, wherein the interconnect structure includes: an inter-level dielectric (ILD) layer; a separation layer above the ILD layer; a first conductor within the ILD layer, wherein the first conductor has a first physical configuration; and a second conductor within the ILD layer, wherein the second conductor has a second physical configuration different from the first physical configuration.

Example 2 may include the semiconductor device of example 1 and/or some other examples herein, wherein the first physical configuration of the first conductor includes a shape, a size, a height, or a material of the first conductor, a first depth from a first surface of the ILD layer to the first conductor, or a second depth from a second surface of the ILD layer to the firs conductor.

Example 3 may include the semiconductor device of any one of examples 1-2 and/or some other examples herein, wherein the first conductor has a surface coplanar with a surface of the ILD layer or a surface of the separation layer.

Example 4 may include the semiconductor device of any one of examples 1-2 and/or some other examples herein, wherein the first conductor or the second conductor includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, TiAlN, HfAlN, or InAlO.

Example 5 may include the semiconductor device of any one of examples 1-2 and/or some other examples herein, wherein the first conductor or the second conductor has a triangular shape, a square shape, a rectangular shape, a circular shape, an elliptical shape, or a polygon comprising three or more sides.

Example 6 may include the semiconductor device of any one of examples 1-2 and/or some other examples herein, wherein the substrate includes a silicon substrate, a glass substrate, a metal substrate, or a plastic substrate.

Example 7 may include the semiconductor device of any one of examples 1-2 and/or some other examples herein, wherein the ILD layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

Example 8 may include the semiconductor device of any one of examples 1-2 and/or some other examples herein, wherein the separation layer includes one or more of an etching stop layer, a barrier layer, a capping layer, or a hard mask layer.

Example 9 may include the semiconductor device of any one of examples 1-2 and/or some other examples herein, wherein the first conductor overlaps and is in direct contact with the second conductor.

Example 10 may include the semiconductor device of any one of examples 1-2 and/or some other examples herein, wherein the interconnect structure further includes an interstitial bridge via within the ILD layer, and the first conductor is coupled to the second conductor through the interstitial bridge via in a lateral direction parallel to a surface of the ILD layer.

Example 11 may include the semiconductor device of any one of examples 1-2 and/or some other examples herein, wherein the interconnect structure further includes an interstitial bridge via within the ILD layer, and the first conductor is coupled to the second conductor through the interstitial bridge via in a vertical direction with respect to a surface of the ILD layer.

Example 12 may include the semiconductor device of example 11 and/or some other examples herein, wherein interstitial bridge via further extends through the separation layer into a second ILD layer above the separation layer.

Example 13 may include the semiconductor device of any one of examples 1-2 and/or some other examples herein, wherein the interconnect structure further includes a sealant layer above, below, or adjacent to the first conductor.

Example 14 may include the semiconductor device of any one of examples 1-2 and/or some other examples herein, wherein the first conductor is a plate of a capacitor formed within the ILD layer, the second conductor is a contact of a transistor within the ILD layer, and wherein the interconnect structure further includes a short via within the ILD layer to couple the first conductor and the second conductor.

Example 15 may include a method for forming a semiconductor device, the method comprising: forming an interlevel dielectric (ILD) layer above a substrate; forming a first conductor within the ILD layer through a first opening in the ILD layer in a first pass, wherein the first conductor has a first physical configuration; forming a second conductor within the ILD layer through a second opening in the ILD layer in a second pass, wherein the second conductor has a second physical configuration different from the first physical configuration; filling the first opening and filling the second opening; and forming a separation layer above the ILD layer.

Example 16 may include the method of example 15 and/or some other examples herein, wherein the first physical configuration of the first conductor includes a shape, a size, a height, or a material of the first conductor, a first depth from a first surface of the ILD layer to the first conductor, or a second depth from a second surface of the ILD layer to the firs conductor.

Example 17 may include the method of any one of examples 15-16 and/or some other examples herein, wherein the first conductor has a surface coplanar with a surface of the ILD layer.

Example 18 may include the method of any one of examples 15-16 and/or some other examples herein, wherein the first conductor or the second conductor includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, TiAlN, HfAlN, or InAlO.

Example 19 may include the method of any one of examples 15-16 and/or some other examples herein, wherein the ILD layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

Example 20 may include the method of any one of examples 15-16 and/or some other examples herein, wherein the separation layer includes one or more of an etching stop layer, a barrier layer, a capping layer, or a hard mask layer.

Example 21 may include the method of any one of examples 15-16 and/or some other examples herein, further comprising: forming an interstitial bridge via within the ILD layer to couple the first conductor with the second conductor.

Example 22 may include a computing device, comprising: a circuit board; and a memory device coupled to the circuit board and including a memory array, wherein the memory array includes a plurality of memory cells, a memory cell of the plurality of memory cells includes a transistor and a capacitor as a storage cell, and wherein the transistor includes: a gate electrode coupled to a word line of the memory array; a source electrode coupled to a bit line of the memory array; a drain electrode coupled to a first plate of the capacitor by a short via; and the capacitor further includes a second plate coupled to a source line of the memory array; wherein the source electrode, the drain electrode, and the first plate of the capacitor are within a dielectric layer above the gate electrode.

Example 23 may include the computing device of example 22 and/or some other examples herein, wherein the gate electrode, the source electrode, the drain electrode, the first plate, or the second plate includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, TiAlN, HfAlN, or InAlO.

Example 24 may include the computing device of any one of examples 22-23 and/or some other examples herein, wherein the transistor is within an interconnect structure that is above a substrate.

Example 25 may include the computing device of any one of examples 22-23 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Example 25 may include one or more computer-readable media having instructions for forming a semiconductor device, upon execution of the instructions by one or more processors, to perform the method of any one of examples 15-21.

Example 27 may include an apparatus for forming a semiconductor device, comprising: means for forming an inter-level dielectric (ILD) layer above a substrate; means for forming a first conductor within the ILD layer through a first opening in the ILD layer in a first pass, wherein the first conductor has a first physical configuration; means for forming a second conductor within the ILD layer through a second opening in the ILD layer in a second pass, wherein the second conductor has a second physical configuration different from the first physical configuration; means for filling the first opening and filling the second opening; and means for forming a separation layer above the ILD layer.

Example 28 may include the apparatus of example 27 and/or some other examples herein, wherein the first physical configuration of the first conductor includes a shape, a size, a height, or a material of the first conductor, a first depth from a first surface of the ILD layer to the first conductor, or a second depth from a second surface of the ILD layer to the firs conductor.

Example 29 may include the apparatus of any one of examples 27-28 and/or some other examples herein, wherein the first conductor has a surface coplanar with a surface of the ILD layer.

Example 30 may include the apparatus of any one of examples 27-28 and/or some other examples herein, wherein the first conductor or the second conductor includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, TiAlN, HfAlN, or InAlO.

Example 31 may include the apparatus of any one of examples 27-28 and/or some other examples herein, wherein the ILD layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

Example 32 may include the apparatus of any one of examples 27-28 and/or some other examples herein, wherein the separation layer includes one or more of an etching stop layer, a barrier layer, a capping layer, or a hard mask layer.

Example 33 may include the apparatus of any one of examples 27-28 and/or some other examples herein, further comprising: means for forming an interstitial bridge via within the ILD layer to couple the first conductor with the second conductor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
an interconnect structure above a transistor above a substrate, wherein the transistor includes a gate electrode having an uppermost surface, and wherein the interconnect structure includes:
a first dielectric separation layer and a second dielectric separation layer, the second dielectric separation layer over and vertically separated from the first dielectric separation layer, and the second dielectric separation layer having a bottommost surface above an uppermost of the first dielectric separation layer;
an inter-level dielectric (ILD) material layer between the first dielectric separation layer and the second dielectric separation layer, the ILD material layer having a planar bottommost surface in contact with the first separation dielectric layer, and a planar uppermost surface in contact with the second dielectric separation layer, wherein the ILD material layer is a single material layer continuous from the planar bottommost surface to the planar uppermost surface;
a first conductor within the ILD material layer, wherein the first conductor has a first physical configuration;
a second conductor within the ILD material layer, wherein the second conductor has a second physical configuration different from the first physical configuration, wherein the second conductor has an uppermost surface at a different level than an uppermost surface of the first conductor, the uppermost surface of the first conductor and the uppermost surface of the second conductor below the planar uppermost surface of the ILD material layer and vertically spaced apart from the second dielectric separation layer, wherein the second conductor has a bottommost surface below a bottommost surface of the first conductor, the bottommost surface of the second conductor vertically overlapping with and vertically spaced apart from the planar bottommost surface of the ILD material layer and the first dielectric separation layer, and the bottommost surface of the second conductor above the uppermost surface of the gate electrode of the transistor, and wherein the uppermost surface of the second conductor is at a level below the uppermost surface and above the bottommost surface of the first conductor;
a via in the ILD material layer, the via extending from a level below the bottommost surface of the second conductor to a level above the uppermost surface of the first conductor, the via laterally spaced apart from the first conductor and the second conductor, and the via having an uppermost surface below the planar uppermost surface of the ILD material layer; and
a third conductor within the ILD material, the third conductor vertically over and coupled to the via, the third conductor having a bottommost surface above the uppermost surface of the second conductor, and the third conductor having an uppermost surface below and in contact with the bottommost surface of the second dielectric separation layer.

2. The semiconductor device of claim 1, wherein the first physical configuration of the first conductor includes a shape, a size, a height, or a material of the first conductor, a first depth from a first surface of the ILD material layer to the first conductor, or a second depth from a second surface of the ILD material layer to the first conductor.

3. The semiconductor device of claim 1, wherein the first conductor or the second conductor includes titanium (Ti), molybdenum (Mo), gold (Au), platinum (Pt), aluminum (Al), nickel (Ni), copper (Cu), chromium (Cr), hafnium (Hf), indium (In), or an alloy of Ti, Mo, Au, Pt, Al, Ni, Cu, Cr, TiAlN, HfAlN, or InAlO.

4. The semiconductor device of claim 1, wherein the first conductor or the second conductor has a triangular shape, a square shape, a rectangular shape, a circular shape, an elliptical shape, or a polygon comprising three or more sides.

5. The semiconductor device of claim 1, wherein the substrate includes a silicon substrate, a glass substrate, a metal substrate, or a plastic substrate.

6. The semiconductor device of claim 1, wherein the ILD material layer includes silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, or organosilicate glass.

7. The semiconductor device of claim 1, wherein the first or second dielectric separation layer includes one or more of an etching stop layer, a barrier layer, a capping layer, or a hard mask layer.

8. The semiconductor device of claim 1, wherein the interconnect structure further includes an interstitial bridge via within the ILD material layer.

9. The semiconductor device of claim 8, wherein interstitial bridge via further extends through the second dielectric separation layer into a second ILD material layer above the second dielectric separation layer.

10. The semiconductor device of claim 1, wherein the interconnect structure further includes a sealant layer above, below, or adjacent to the first conductor.

11. The semiconductor device of claim 1, wherein the first conductor is a plate of a capacitor formed within the ILD material layer, the second conductor is a contact of a transistor within the ILD material layer, and wherein the interconnect structure further includes a short via within the ILD material layer to couple the first conductor and the second conductor.

* * * * *